(12) United States Patent
Long et al.

(10) Patent No.: US 7,631,798 B1
(45) Date of Patent: Dec. 15, 2009

(54) METHOD FOR ENHANCING THE SOLDERABILITY OF A SURFACE

(76) Inventors: Ernest Long, 78 Taine Mountain Rd., Burlington, CT (US) 06013; Lenora M. Toscano, 489 Wolcott St., Unit 42, Bristol, CT (US) 06010; Paul Romaine, 161 Colonial St., Oakville, CT (US) 06779; Colleen McKirryher, 399 D Welton Way, Thomaston, CT (US) 06787; Donna M. Kologe, 56 Woodruff Ave., Thomaston, CT (US) 06787; Steven A. Castaldi, 134 Farmstead La., Torrington, CT (US) 06790; Carl P. Steinecker, 12423 Sunview Ct., South Lyon, MI (US) 48178

( * ) Notice: Subject to any disclaimer, the term of this patent is extended or adjusted under 35 U.S.C. 154(b) by 0 days.

(21) Appl. No.: 12/244,136

(22) Filed: Oct. 2, 2008

(51) Int. Cl.
  B23K 35/24 (2006.01)
  B23K 35/36 (2006.01)
  B05D 5/12 (2006.01)
(52) U.S. Cl. .................. 228/262.61; 228/256; 427/125
(58) Field of Classification Search ........................ None
  See application file for complete search history.

(56) References Cited

U.S. PATENT DOCUMENTS

| | | |
|---|---|---|
| 4,940,181 A | 7/1990 | Juskey, Jr. et al. |
| 4,978,423 A | 12/1990 | Durnwirth, Jr. et al. |
| 5,160,579 A | 11/1992 | Larson |
| 5,173,130 A | 12/1992 | Kinoshita et al. |
| 5,235,139 A | 8/1993 | Bengston et al. |
| 5,514,501 A * | 5/1996 | Tarlov ........................... 430/5 |
| 5,556,023 A * | 9/1996 | Kuramoto et al. ......... 228/248.1 |
| 5,750,271 A * | 5/1998 | Kuramoto et al. ........... 428/624 |
| 5,928,440 A * | 7/1999 | Kuramoto et al. ............. 148/24 |
| 5,977,249 A * | 11/1999 | Kovar et al. ................. 524/723 |
| 6,375,822 B1 * | 4/2002 | Taytsas ........................ 205/85 |
| 6,461,682 B1 * | 10/2002 | Crotty et al. ................ 427/387 |
| 6,476,487 B2 * | 11/2002 | Kuramoto et al. ........... 257/738 |
| 6,506,314 B1 | 1/2003 | Whitney, Jr. et al. |
| 7,279,173 B2 * | 10/2007 | Schiestel et al. ............ 424/421 |
| 2002/0160199 A1 * | 10/2002 | Hofacker et al. ............ 428/412 |
| 2002/0172776 A1 * | 11/2002 | Crotty et al. ................ 427/387 |
| 2003/0171506 A1 * | 9/2003 | Kataoka et al. ............. 525/535 |
| 2004/0029834 A1 * | 2/2004 | Schiestel et al. .............. 514/63 |
| 2005/0106570 A1 * | 5/2005 | Kataoka et al. ................ 435/6 |
| 2005/0206994 A1 * | 9/2005 | Kokeguchi et al. .......... 359/296 |
| 2006/0161015 A1 * | 7/2006 | Klockmann et al. ......... 556/427 |
| 2007/0269924 A1 * | 11/2007 | Gomez et al. ................ 438/99 |
| 2008/0096046 A1 | 4/2008 | Yamashita et al. |
| 2009/0065742 A1 * | 3/2009 | Shih et al. ............... 252/301.36 |

FOREIGN PATENT DOCUMENTS

| | | | |
|---|---|---|---|
| JP | 58148441 A | * | 9/1983 |
| JP | 63309589 A | * | 12/1988 |
| JP | 08204067 A | * | 8/1996 |

* cited by examiner

*Primary Examiner*—Kiley Stoner
(74) *Attorney, Agent, or Firm*—Carmody & Torrance LLP

(57) ABSTRACT

A method for enhancing the solderability of a metallic surface is disclosed where the metallic surface is plated with a silver plate prior to soldering, which immersion silver plate is treated with an additive comprising a mercapto substituted or thio substituted silane compound. Preferred post treatments comprise 3-mercapto propyl trimethoxysilane and/or 3-oxtanoylthio-1-propyltriethoxy silane.

9 Claims, No Drawings

METHOD FOR ENHANCING THE SOLDERABILITY OF A SURFACE

FIELD OF THE INVENTION

This invention relates generally to a method of treating a surface which treatment enhances the solderability of the surface. The method is particularly useful in the fabrication and assembly of printed circuit boards.

BACKGROUND OF THE INVENTION

Soldering is generally used for making mechanical, electromechanical, or electronic connections to a variety of articles. The distinction between expected functions of the joints is important because each application has its own specific requirements for surface preparation. Of the three soldering applications, making electronic connections is the most demanding.

In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by various soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces.

One means of arranging good solderability of the surfaces in question is to provide the surfaces with a pre-coating of solder. This is typically performed by a process called hot air solder leveling or through some type of plating process. In printed circuit fabrication, however, this method has several drawbacks. The use of hot air solder leveling may cause an unacceptably high rate of defects due to shorts, particularly when dealing with small circuits. If plating is used, since it is not easy to selectively provide these areas with solder, all conductive areas of the board must be solder plated causing severe problems with the subsequent application of solder mask. In addition the foregoing processes are inefficient and relatively expensive.

Another means of arranging good solderability of these surfaces is to plate them with a final finish coating of a precious metal such as gold, palladium or rhodium. U.S. Pat. No. 5,235,139 (Bengston, et. al.), the teachings of which are incorporated herein by reference, proposes a method for achieving this precious metal final finish. Bengston et. al. propose plating the copper areas to be soldered with electroless nickel-boron, followed by a precious metal coating such as gold. See also U.S. Pat. No. 4,940,181 to Juskey, Jr. et al., the teachings of which are incorporated herein by reference for a similar process which teaches the plating of electroless copper, followed by electrolytic copper, followed by nickel, followed by gold as a solderable surface. These processes work well but are time consuming and expensive.

Various attempts have been made to selectively apply solder to the necessary areas only. One such method involves use of organic etch resists over the solder plated areas of connection followed by selective stripping of tin-lead from the copper traces before application of the solder mask. See U.S. Pat. No. 4,978,423 to Durnwith et. al. See also U.S. Pat. No. 5,160,579 to Larson, the teachings of which are incorporated herein by reference, for other known selective solder processes.

Soldering directly to copper surfaces has been difficult and inconsistent. These problems are due mainly to the inability of keeping the copper surfaces clean and free of oxidation throughout the soldering operation. Various organic treatments have been developed to preserve copper surfaces in a readily solderable state. For example, see U.S. Pat. No. 5,173,130 (Kinoshita) which teaches the use of certain 2-alkylbenzimidazoles as copper pre-fluxes to preserve the solderability of the copper surfaces. Treatments such as those taught in Kinoshita have proven successful but there is still need to improve the reliability of the process.

The method of preserving solderability proposed herein is the coating of copper surfaces to be soldered with a silver plate prior to soldering. It has been found, however, that when the foregoing method is used the silver coating has a tendency to corrode, especially if exposed to environments containing sulfur compounds. This corrosion may continue at interfaces even after the soldering is complete thereby weakening the solder connection.

It is an object of this invention to propose a method for preserving and enhancing the solderability of copper surfaces by plating said copper surface with an immersion silver plate followed by a post-treatment, thereby making the silver plate more resistant to corrosion than prior art immersion silver deposits and ensuring a strong, long lasting solder bond.

SUMMARY OF THE INVENTION

The current invention proposes the use of an immersion or electroless silver coating as an improved solderability preservative for various surfaces, particularly copper surfaces. Preferred compositions for depositing the silver coating are also disclosed. The proposed silver plating process produces a silver plate which is more resistant to corrosion and degradation than conventional silver deposits. The process proposed is a versatile, low cost method for effectively preserving the solderability of surfaces, particularly copper surfaces and Areas of Connection on printed circuit boards.

DETAILED DESCRIPTION OF THE INVENTION

The current invention proposes a process for preserving and enhancing the solderability of a metal surface, particularly copper surfaces. The proposed process comprises the following steps:

a). cleaning the metal surfaces;
b). optionally, etching the metal surfaces;
c). treating the metal surface with an immersion or electroless silver plating solution;
d). treating the silver plated surface with a solution which comprises a mercapto or thio silane compound.

Preferably, the silver plating solution is an immersion or electroless silver plating solution. It has been discovered that immersion silver deposits provide excellent solderability preservatives, which are particularly useful in the fabrication of printed circuit boards. The solderability achievable with a simple immersion or electroless silver deposit in printed circuit applications has unexpectedly been found to exceed that achievable with prior art nickel-gold plating processes such as described in U.S. Pat. No. 5,235,139 and unexpectedly exceeds that achievable with other immersion deposits. As can be seen in the examples to follow, the processes of the current invention yield surfaces which are very solderable under adverse conditions. In printed circuit applications the surfaces prepared in accordance with this invention are wire bondable. Immersion plating is a process which results from a replacement reaction whereby the surface being plated dissolves into solution and at the same time the metal being plated deposits from the plating solution onto the surface. The immersion plating initiates without prior activation of the surfaces. The metal to be plated is generally more noble than the surface metal. Thus immersion plating is usually easier to control and more cost effective than electroless plating, which may require sophisticated auto catalytic plating solutions and processes for activation of the surfaces prior to plating. As a result immersion silver plating is preferred in the process of this invention.

The silver plating solution generally contains a soluble source of silver ions in an acid aqueous matrix. The soluble source of silver ions can be derived from a variety of silver compounds. The inventors have found silver nitrate to be most preferable. The concentration of silver in the plating solution can generally range from 0.1 to 25 grams per liter, but is most preferably present in a concentration of 0.5 to 2 grams per liter. Although a variety of acids are suitable for use in this formulation, the inventors have found that methane sulfonic acid or nitric acid is most preferred. The concentration of acid in the plating solution can generally range from 1 to 150 grams per liter but is preferably in the range of 5 to 50 grams per liter.

The inventors have discovered that the inclusion of an imidazole or imidazole derivative of the following formula has a significant positive impact upon the plate produced by immersion plating solutions, particularly immersion silver plating solutions used in the processes of this invention:

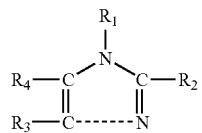

Wherein $R_1$, $R_2$, $R_3$ and $R_4$ are independently selected from the group consisting of substituted or unsubstituted alkyl groups, substituted or unsubstituted aryl groups, halogens, nitro groups and hydrogen.

The inclusion of an imidazole as described above brightens the plated deposit and improves the integrity and physical properties of the resultant plated deposit. In addition, the imidazole also extends the useful life of the immersion plating solution. The inventors have found that histidine is a particularly preferred imidazole for the purposes of these processes.

The inclusion of imidazoles provides significant advantages in immersion plating solutions in general, but is particularly useful and advantageous in immersion silver plating. The inventors have found that immersion silver deposits resulting from plating baths containing imidazoles are brighter, smoother and more cohesive than immersion silver deposits plated from baths which do not have imidazoles. In addition the immersion plating baths with imidazoles have longer effective lives than comparable baths without imidazoles.

With respect to the immersion silver compositions useful in the present invention, the plating solution may, optionally, advantageously also contain an oxidant. The inventors have found that nitro aromatic compounds most preferably dinitro compounds, such as 3,5 dinitrohydroxybenzoic acid are preferred in this regard. The concentration of such an oxidant in the solution can range from 0.1 to 25 grams per liter, but is preferably from 0.5 to 2 grams per liter.

The immersion silver solution can be used in the processes of the current invention at temperatures ranging from room temperature to 200° F. but is preferably used at from 80 to 120° F. The time for immersion in the plating solution can range from 1 to 30 minutes but is preferably from 1 to 5 minutes.

The immersion silver solution of the current invention is thus used to plate a thin layer of silver onto the surface to be soldered. It is believed that the resultant silver coating should be from 1 to 100 micro inches thick, preferably from 10 to 60 micro inches thick for effective enhancement and preservation of the solderability of the surface. Although this process is effective in soldering many surfaces, it is particularly useful in soldering copper surfaces, such as Areas of Connection on printed circuit boards.

After the Areas of Connection are silver plated, they should be treated (contacted) with a solution comprising a mercapto or thio silane compound. The mercapto or thio substituted silane of this invention is preferably a multifunctional mercapto or thio substituted organic silane of the following chemical formula:

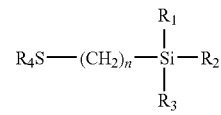

Wherein R1, R2, R3 and R4 are independently selected from the group consisting of alkoxy groups (e.g., methoxy, ethoxy, or similar alkoxy groups), alkyl groups, aryl groups, and hydrogen groups, and wherein n is an integer from 1 to 5 but is preferably an integer from 2 to 3. A particularly preferred mercapto-substituted silane is 3-mercapto propyl trimethoxy silane:

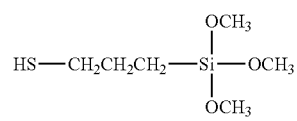

The inventors have found 3-mercapto propyl trimethoxysilane or 3-octanoylthio-1-propyltriethoxysilane to be most preferred mercapto or thio substituted silane for use in this invention. These silanes are available from the G.E. Silicones of Wilton, Conn. under the tradename SILQUEST® A-189 Silane and SIQUEST® A599 respectively. Other useful mercapto or thio substituted silanes include (3-mercaptopropyl) methyl dimethoxy silane available from the Fluka Chemie AG of Buchs, Switzerland. The inventors have unexpectedly discovered that the mercapto group on these mercapto or thio substituted silanes provides significantly better corrosion protection than is provided by other silanes which do not have the mercapto or thio substituted group. Thus, the inventors believe that the mercapto or thio substitution on the silane provides significant and unexpected improvements in corrosion protection and adhesion promotion in relation to non-mercapto or thio substituted silanes.

The mercapto or thio substituted silane is preferably solubilized, with a suitable solvent, into a treatment solution. The concentration of mercapto or thio substituted silane in the treatment solution may be from 0.5 to 10% by weight but is preferably from 2 to 4% by weight. Mercapto-substituted silanes, such as gamma-mercaptopropyltrimethoxy silane, may not be soluble in water alone to the extent necessary to practice this invention effectively. The inventors have discovered that a combination of water with an appropriate solvent may be required to effectively solubilize these mercapto-substituted silanes in a water matrix. Appropriate solvents for this purpose include N-methyl-2-pyrrolidone, butyrolactone, diethylene glycol butyl ether, hexylene glycol, ethylene glycol monobutyl ether and alcohols. Most preferred as a solubilization matrix for the mercapto-substituted silanes is ethylene glycol monobutyl ether or a glycol monoether such as DOWANOL® DPM available from the Dow Chemical Company, each of which may be used with water or alone as the solvent matrix. Preferably, the mercapto-substituted silane is added to the solvent (e.g. ethylene glycol monobutyl ether) and then, if water is desired, that mixture is added to the water, with stirring to form the treatment solution. The inventors have found that an aqueous solution of ethylene glycol monobutyl ether does an excellent job of solubilizing the mercapto-substituted silane and leaves behind a spot free finish as it evaporates from the treated surface. Further, it is also acceptable to prepare the post-treatment solution without water by merely dissolving the silane in one or more of the organic solvent(s) listed. The concentration of solvent in the water, if water is used, must be adjusted in order to properly solubilize and/or maintain the mercapto-substituted silane in solution. The inventors have found that ratios of water to ethylene glycol monobutyl ether concentration, based on volume percentages of from 65/35 to 94/6 were suitable for mercapto-substituted silane concentrations of from 5 to 0.5 volume percent. The aqueous solution of the mercapto-substituted silane will hydrolyze the silane and will improve its effectiveness in treating the metal surfaces. The pH of the treatment solution should be less than 7 and is preferably between about 3 and 5. The inventors have found that using an aqueous solution of the foregoing solvents and the mercapto-substituted silane, the treatment solution will naturally make up at a pH of about 4. Acetic acid can be used to make any needed adjustments to pH. The concentration of mercapto or thio substituted silane may range from 0.5 to 10 percent by volume, but is preferably from 2 to 5 percent by volume of the treatment solution. Most preferably, the mercapto or thio substituted silane is dissolved in one or more of the listed organic solvents without water, and in this case pH is not a factor.

After application of the silane post treatment of this invention, the treated surfaces are preferably rinsed with water and then baked dry at about 100° C. to 1500° C. for 1 to 30 minutes, preferably at 130° C. to 150° C. for about 10 minutes.

Although this technique may be utilized advantageously over almost any surface, it is most useful in the fabrication of printed circuit boards, particularly solder mask over bare copper (SMOBC) boards. Thus, in fabricating SMOBC boards, the solder mask is applied to the surfaces of the board then exposed and developed to reveal the Areas of Connection. These Areas of Connection are then essentially the only exposed areas of copper on the board, with the remainder essentially being covered by solder mask. These exposed Areas of Connection are thus destined to be points of attachment, in most cases by soldering, when the electronic components are later placed on the board later in the fabrication cycle. Therefore, the solderability of these exposed points, generally copper, must be enhanced and preserved.

Thus according to the current invention these areas are then preferably cleaned, using an acid cleaner, and subsequently microetched to prepare the surface for acceptable immersion plating. Following this preferred preparation, the board is immersed in the immersion silver plating solution, such that a silver deposit of appropriate thickness is achieved and thereafter treated with the post treatment taught in this invention.

The invention is further described for illustrative purposes only in the following examples which are in no way limiting of the invention itself.

Example I

Circuit boards were processed with the following steps:
a). Acid Cleaner, 5 minutes, 120° F.
b). Water Rinse
c). Sodium persulfate/sulfuric acid microetch, 1 minute, 95° F.
d). Water rinse
e). Silver plate using the following composition:

| | |
|---|---|
| hydroxy ethylenediamine tetraacetic acid | 10 gr/l |
| silver nitrate | 2.4 gr/l |
| IGEPAL ® Co730 | 5.0 gr/l |
| imidazole | 10 gr/l |
| nitric acid | 32.0 ml/l | f). water rinse.

Example II

Circuit boards were treated as noted in Example 1 except in this case after step (f) the circuit boards were further processed as follows:
g). treatment with an aqueous solution containing:

| Component | Concentration (% by wt.) |
|---|---|
| SILQUEST A599 ® | 3% |
| SILQUEST A189 ® | 1% |
| DOWANOL DPM ® | 85% |
| Water | 11% | h). water rinse.
i). Bake at 140° C. for 10 minutes.

The circuit boards of Examples I and II were then tested for solderability and corrosion resistance in a sulfurous atmosphere. The parts treated with the post treatment of Example II showed about 80% less corrosion than those of Example I. The parts of Example II also showed improved solderability as compared to Example I.

What is claimed is:

1. A process for improving the solderability of a metal surface, said process comprising:
    a) contacting the metal surface with a silver plating solution thereby producing a silver plate upon the metal surface; and thereafter
    b) treating the silver plated metal surface with a solution comprising a mercapto substituted silane or thio substituted silane.

2. A process according to claim 1 wherein the silver plating solution comprises a material selected from the group consisting of imidazoles, benzimidazoles, imidazole derivatives and benzimidazole derivatives.

3. A process according to claim 1 wherein the silver plating solution also comprises an oxidant.

4. A process according to claim 1 wherein the metal surface comprises copper.

5. A process according to claim 1 wherein the additive is selected from the group consisting of 3-mercapto propyl trimethoxysilane and 3-octanoylthio-1-propyltriethoxy silane.

6. A process according to claim 4 wherein the silver plating solution comprises a material selected from the group consisting of imidazoles, benzimidazoles, imidazole derivatives, and benzimidazole derivatives.

7. A process according to claim 6 wherein the silver plating solution also comprises an oxidant.

8. A process according to claim 7 wherein the additive is selected from the group consisting of 3-mercapto propyl trimethoxysilane and 3-octanoylthio-1-propyltriethoxy silane.

9. A process according to claim 5 wherein the solution comprises a glycol monoether.

* * * * *